(12) United States Patent
Ma et al.

(10) Patent No.: US 10,128,875 B1
(45) Date of Patent: Nov. 13, 2018

(54) METHODS AND SYSTEM OF A DIGITAL TRANSMITTER WITH REDUCED QUANTIZATION NOISE

(71) Applicant: Mitsubishi Electric Research Laboratories, Inc., Cambridge, MA (US)

(72) Inventors: Rui Ma, Lexington, MA (US); Daniel Antonio Da Costa Dinis, Santa Comba Dao (PT)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 15/941,054

(22) Filed: Mar. 30, 2018

(51) Int. Cl.
    *H04B 1/04*     (2006.01)
    *H03M 3/00*     (2006.01)

(52) U.S. Cl.
    CPC .......... *H04B 1/0475* (2013.01); *H03M 3/412* (2013.01)

(58) Field of Classification Search
    CPC .............................. H04B 1/0475; H03M 3/412
    See application file for complete search history.

(56) References Cited

U.S. PATENT DOCUMENTS

| | | | |
|---|---|---|---|
| 5,629,701 A | 5/1997 | Ritoniemi et al. | |
| 5,959,562 A * | 9/1999 | Wiesbauer | H03M 3/38 341/143 |
| 7,129,778 B2 | 10/2006 | Robinson | |
| 9,681,231 B2 | 6/2017 | Yasuda et al. | |
| 2007/0152859 A1* | 7/2007 | Reefman | H03M 3/50 341/144 |
| 2012/0139764 A1* | 6/2012 | Sosio | H03M 3/344 341/110 |
| 2014/0240154 A1* | 8/2014 | Kim | H03M 3/32 341/143 |

\* cited by examiner

*Primary Examiner* — Nguyen Vo
(74) *Attorney, Agent, or Firm* — Gennadiy Vinokur; James McAleenan; Hironori Tsukamoto

(57) ABSTRACT

A digital transmitter includes baseband interfaces to generate digital baseband signals with baseband frequencies, digital-upconverting stages to upconvert the baseband frequencies to first radio frequencies having a predetermined frequency range, a M-Band $\Delta\Sigma M$ modulator to modulate the up-stage signals based on noise shaping and noise quantization processes, delay registers to align phases of the modulated up-stage signals, a noise canceler to generate noise canceling signals with a converted polarity, a Switch Mode Power Amplifier to amplify the phase aligned modulated up-stage signals up to a predetermined power level, a linear power amplifier to amplify the noise canceling signals up to the predetermined power level, a power combiner to combine to generate transmitting signals by combining the amplified phase aligned modulated up-stage signals and the amplified noise canceling signals, and an antenna to transmit the transmitting signals.

18 Claims, 7 Drawing Sheets

|  | Fcarrier 1 | | Fcarrier 2 | |
|---|---|---|---|---|
|  | NMSE (dB) | ACPR T (dBc) | NMSE (dB) | ACPR T (dBc) |
| w/o NC | -36.55 | 31.68 | -35.69 | 32.33 |
| w/ 5 bit NC | -35.83 | 34.30 | -34.68 | 34.35 |
| w/ 6 bit NC | -38.64 | 39.97 | -37.01 | 39.85 |
| w/ 7 bit NC | -39.77 | 44.27 | -37.81 | 44.29 |

FIG. 7

METHODS AND SYSTEM OF A DIGITAL TRANSMITTER WITH REDUCED QUANTIZATION NOISE

FIELD OF THE INVENTION

This invention generally relates to a digital transmitter (TX) for reducing quantization noise, more specifically, to a digital TX having a quantization noise canceler.

BACKGROUND OF THE INVENTION

During the last few years, the concept of All-Digital Transmitters (ADTs) have attracted considerable attention from both the research and the industry community, due to their capability to design integrated, reconfigurable, agile, multiband and multi-standard transmitters in a highly-efficient and flexible way.

Switch mode PA (SMPA) is normally used to efficiently amplify the incoming digital signal to certain amplitude for a reliable wireless communication. Up to the input of SMPA, both power encoding and digital modulation can be implemented in digital domain, with high flexibility. Generally, a band-pass filter is needed to reconstruct a switch mode power amplifier (SMPA) output signal from digital waveform into analog waveform to meet the out of band spectrum regulations before emitted via antenna. Nevertheless, the underlying quantization process of power encoding is highly non-linear, and thus, a considerable amount of in- and out of band distortion is generated and must be considered in the design of the whole transmitter front-end.

Accordingly, there is a need to provide an improved digital TX for reducing quantization noise.

SUMMARY OF THE INVENTION

Some embodiments are based on recognition that it is possible to realize a novel approach towards the design of analog filter-free All-Digital RF Transmitters suitable for both single- and multi-band scenarios. In some cases, the implementation of a feedforward technique can be targeted with the overall aim of analog canceling the digitally estimated out-of-band quantization noise.

According to some embodiments, a noise canceler for reducing quantization noises of transmitting signals, includes a comparator having first and second input ports, wherein the first input port receives an input signal of a first quantizer and the second input port receives an output signal of the first quantizer, wherein the input and output signals of the first quantizer are subtracted to extract a noise component of the input signal of the first quantizer; a noise transfer function (NTF) block to apply a noise transfer function to the noise component of the input signal to generate an NTF noise signal; a polarity convertor to reverse a polarity of the NTF noise signal into an opposite polarity; and a second quantizer to generate an N-bit quantization noise signal by quantizing the converted NTF noise signal by N bits, wherein N is a natural number.

Further, an embodiment of the present disclosure provides a digital transmitter that includes baseband interfaces to generate digital baseband signals at baseband frequencies; digital-upconverting to upconvert the baseband frequencies to first radio frequencies (RFs) having a predetermined frequency range; a M-Band (single band or multiple bands) $\Delta\Sigma$ modulator to modulate the upconverted signals based on noise shaping and noise quantization processes; delay registers to align phases of the modulated up-stage signals; a noise canceler to generate noise canceling signals with a converted polarity; a Switch Mode Power Amplifier (SMPA) to amplify the phase aligned modulated up-converted signals up to a predetermined power level; a linear power amplifier (linear PA) to amplify the noise canceling signals up to the predetermined power level; a power combiner to combine to generate transmitting signals by combining the amplified phase aligned modulated up-stage signals and the amplified noise canceling signals; and an antenna to transmit the transmitting signals, wherein the noise canceler includes a comparator having first and second input ports, wherein the first input port receives an input signal of a first quantizer and the second input port receives an output signal of the first quantizer, where the input and output signals of the first quantizer are subtracted to extract a noise component of the input signal of the first quantizer; a noise transfer function (NTF) block to apply a noise transfer function to the noise component of the input signal to generate an NTF noise signal; a polarity convertor to reverse a polarity of the NTF noise signal into an opposite polarity; and a second quantizer to generate an N-bit quantization noise signal by quantizing the converted NTF noise signal by N bits, wherein N is a natural number.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

FIG. 7 is a table indicating the simulated in-band and out-of-band FoMs (figure of merits) for the cases with and without NC for a 16-Quadrature Amplitude Modulation (QAM), 21.5 MHz per band, according to embodiments of the present disclosure.

Figure 1:
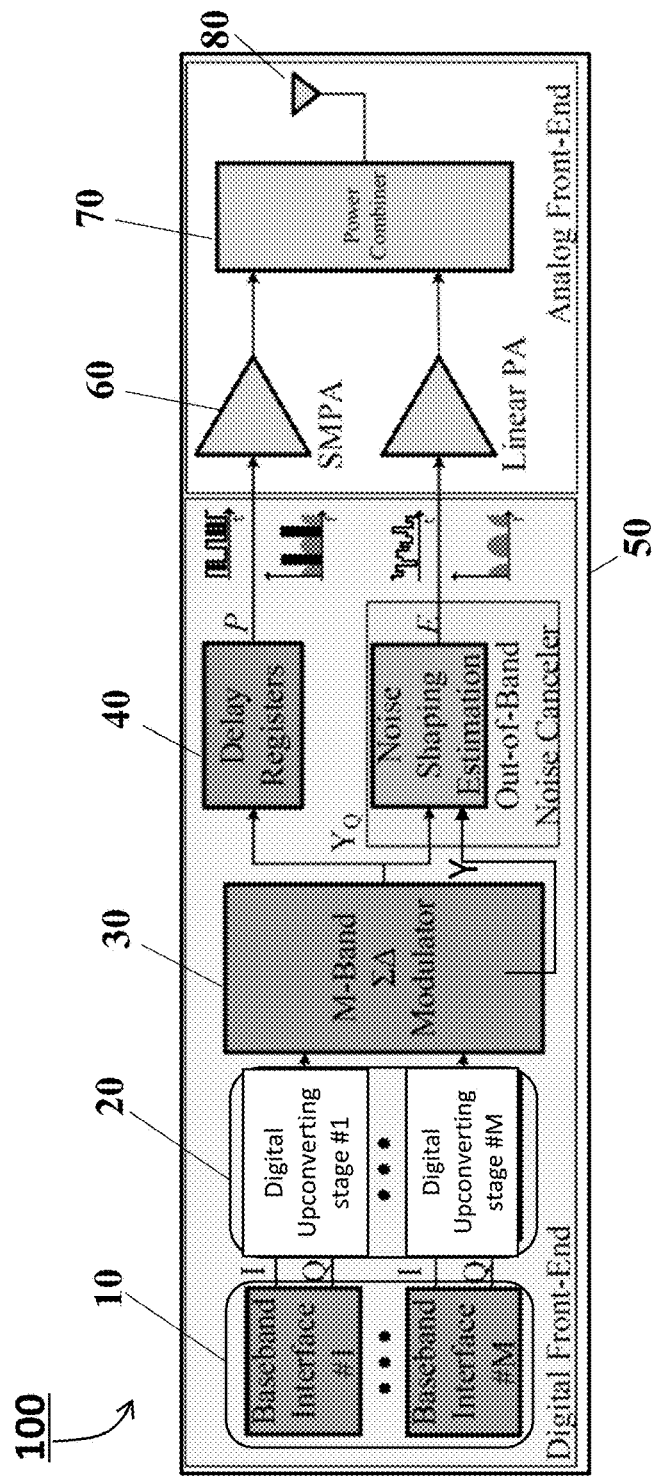
FIG. 1 is an example illustrating a block diagram of all-digital transmitter including out-of-band noise canceler function, according to embodiments of the present disclosure.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION OF THE PREFERRED EMBODIMENTS

Various embodiments of the present invention are described hereafter with reference to the figures. It would be noted that the figures are not drawn to scale elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention.

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

A new optimization technique for reducing quantization noises will be described below for reducing the complexity of out-of-band NC through digitally estimation of the $\Delta\Sigma M$'s quantization noise. The present disclosure provides with simulations demonstrating that this low-complex technique demonstrate significant improvements in terms of the major FoMs, at the same time that may lead to analog-filter-free ADT, regardless of the number of bands.

Some embodiments of the present disclosure are based on recognition that a digital transmitter that includes baseband interfaces to generate digital baseband signals with baseband frequencies; digital-up converting stages to upconvert the baseband frequencies to first radio frequencies (RFs) having a predetermined frequency range; a M-Band $\Delta\Sigma M$ modulator to modulate the upconverted signals based on noise shaping and noise quantization processes; delay registers to align phases of the modulated up-stage signals; a noise canceler to generate noise canceling signals with a converted polarity; a Switch Mode Power Amplifier (SMPA) to amplify the phase aligned modulated upconverted stage signals up to a predetermined power level; a linear power amplifier (linear PA) to amplify the noise canceling signals up to the predetermined power level; a power combiner to combine to generate transmitting signals by combining the amplified phase aligned modulated up-stage signals and the amplified noise canceling signals; and an antenna to transmit the transmitting signals, wherein the noise canceler includes a comparator having first and second input ports, wherein the first input port receives an input signal of a first quantizer and the second input port receives an output signal of the first quantizer, where the input and output signals of the first quantizer are subtracted to extract a noise component of the input signal of the first quantizer; a noise transfer function (NTF) block to apply a noise transfer function to the noise component of the input signal to generate an NTF noise signal; a polarity convertor to reverse a polarity of the NTF noise signal into an opposite polarity; and a second quantizer to generate an N-bit quantization noise signal by quantizing the converted NTF noise signal by N bits, wherein N is a natural number.

FIG. 1 is an example illustrating an architecture of an all-digital transmitter (ADT) 100 according to some embodiments of the present disclosure. The ADT 100 may include baseband interfaces 10 (#1~#M indicating the number of baseband), Digital-Upconverting Stages 20 (#1~#M), a M-Band $\Delta\Sigma$ (delta sigma) modulator 30, delay registers 40, an out-of-Band noise canceler 50, a Switch Mode Power Amplifier (SMPA) 60, a linear power amplifier 61 (linear PA), a power combiner 70 and an antenna 80. The signals I (in-phase) and Q (quadrature-phase) of the baseband interfaces 10 are input to the Digital-Upconverting-Stages 20, respectively. The upconverted signals at Digital-Upconverting 20 are received by the M-Band $\Delta\Sigma$ modulator 30, which generates a signal Y (Y(z)) with noise shaping and a pulsed waveform $Y_q$ ($\Delta\Sigma M$'s pulsed waveform $Y_q(z)$ with quantization noise). Further, the M-Band $\Delta\Sigma$ modulator 30 transmits the signal Y to the Out-of Band Noise Canceler 50, and transmits the pulsed waveform $Y_q$ to the delay registers 40 and the Out-of Band Noise Canceler 50, respectively. By leveraging the signal Y and the pulsed waveform $Y_q$, the Out-of Band Noise Canceler 50 generates a second signal E(z) by extracting the quantization noises from the signal Y and transmits the second signal E(z) to the linear PA 61. In this case, it should be noted that a polarity reversion is performed by a polarity converter (not shown) included in the Out-of Band Noise Canceler 50 before transmitting the second signal E(z) to the linear PA 61 according to embodiments of the present disclosure. At the power combiner 70, the amplified digital signal P from the SMPA 60 and the amplified second signal E(z) from the linear PA 61 are combined so that quantization noises are substantially reduced from the signal Y and low noise output signals are transmitted via the antenna 80.

As is seen in the figure, the SMPA 60 is used to efficiently amplify the incoming digital signal (pulsed waveform $Y_q$) to a digital signal P having a certain amplitude for a reliable wireless communication. The digital signal P can be either two level or multi-level based on the design details. The digital signal P is in a rectangular waveform to switch ON and OFF the SMPA 60 as a control signals. These digital signals are generated through a power encoding stage (not shown) and modulated from the baseband I (in-phase)/Q (quadrature) signals of the baseband interfaces 10 to radio frequency (RF) signals. Up to the input of SMPA 60, both power encoding and digital modulation can be implemented in digital domain, with high flexibility.

Quantization Noise Cancellation Architecture

Figure 2:
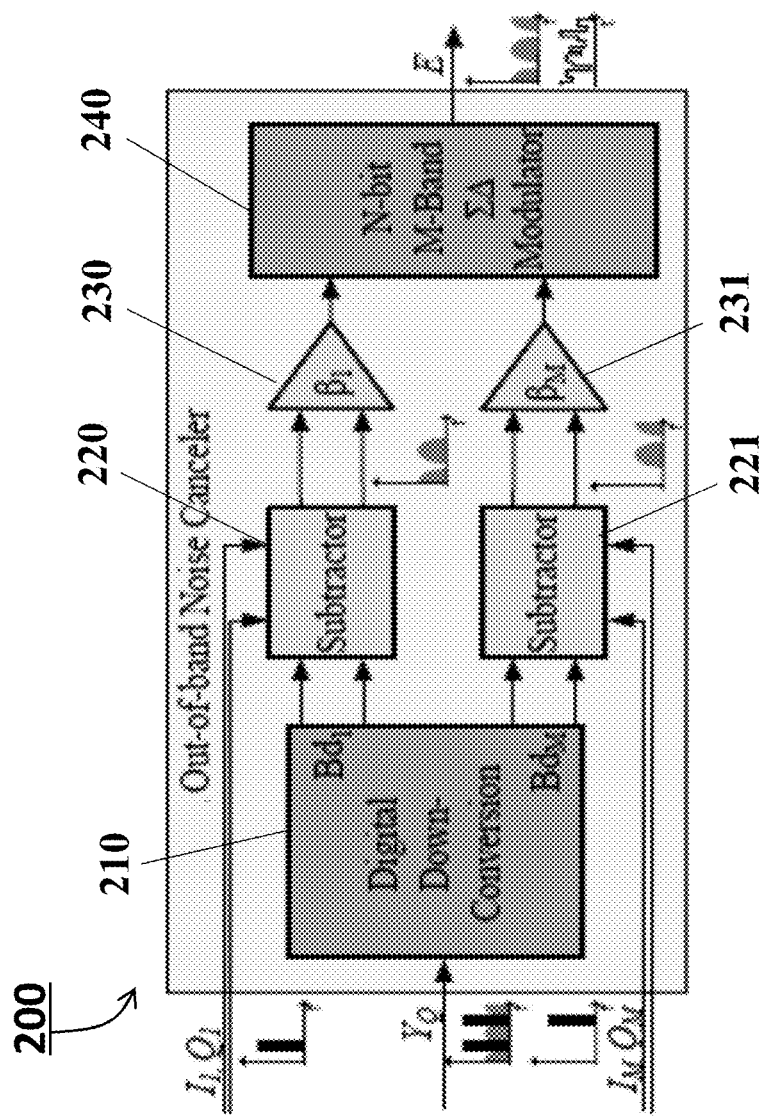
FIG. 2 is a block diagram of an Out-of-Band Noise Canceler of a related art.

In accordance with some embodiments of the present disclosure, a quantization noise cancellation architecture is described in more detail below. FIG. 2 is a block diagram of a related art Out-of-Band Noise Canceler 200. The Out-of- Band Noise Canceler 200 includes a digital down converter 210, subtractors 220 and 221, power amplifiers 230 and 231 and an N-bit M-Band ΔΣ modulator 240.

Figure 3:
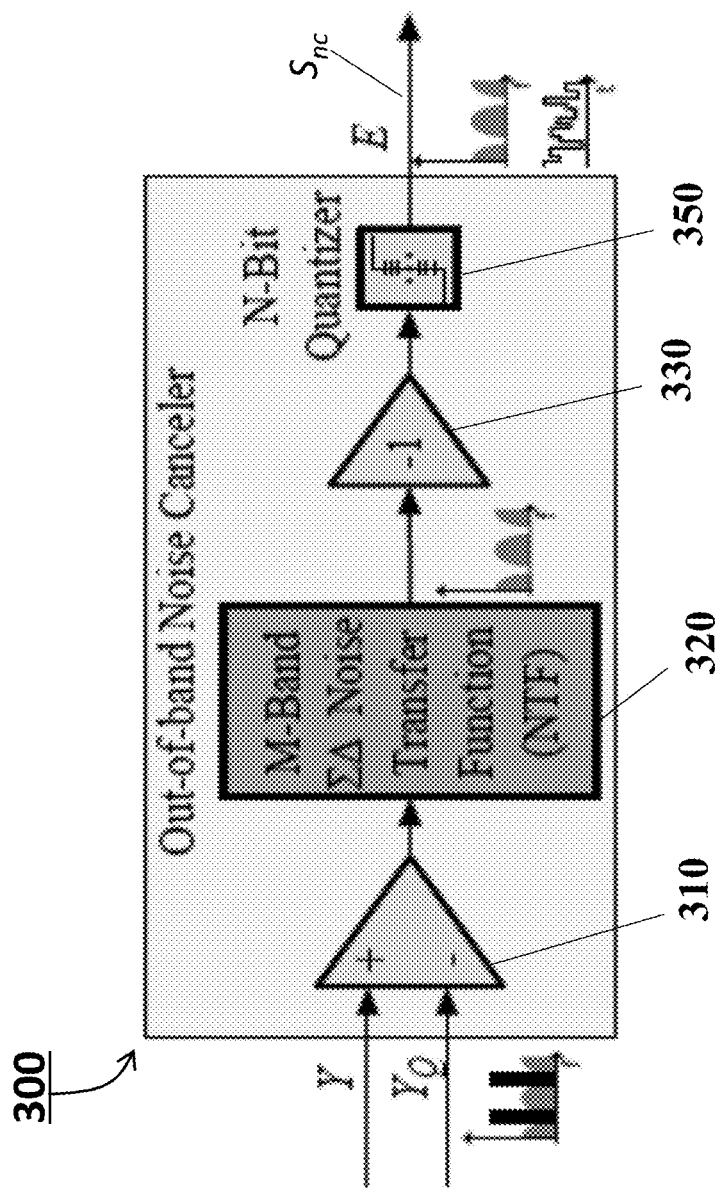
FIG. 3 is an example illustrating a block diagram of an Out-of-band NC, according to embodiments of the present disclosure.

FIG. 3 is an example illustrating a block diagram of the out-of-band NC 300 according to some embodiments of the present disclosure. It should be noted that a circuit configuration of the out-of-band NC 300 of the present disclosure is much simpler than that of the Out-of-Band Noise Canceler 200 of the related art. This can be great advantageous for a lower cost manufacturing and the reduction of the power consumption in a transmitter circuit.

The out-of-band NC 300 includes a comparator 310, a M-Band ΔΣ noise transfer function (NTF) module 320, a polarity converter module 330, and an N-Bit Quantizer module 350. The comparator 310, which is disposed before the M-Band ΔΣ noise transfer function (NTF) module 320, receives the signal Y and the pulsed waveform $Y_q$ from the M-band ΔΣ modulators 30 and performs data processing to extract the noise components contained in the signal Y. The M-Band ΔΣ module 320 applies the M-Band ΔΣ noise transfer function to the extracted noise component. This makes it possible for one to compute a variable that represents a quantization noise. At the polarity converter module 330, a polarity of the variable produced by the M-Band ΔΣ NTF module 320 is converted into an opposite polarity. Further, the N-Bit Quantizer module 350 reduces the number of levels of the converted variable into N-bit, and the N-bit quantized variable is output from the out-of-band NC 300 as an output signal $S_{nc}$ of the out-of-band NC 300. In some cases, the polarity converter 330 may be arranged after the N-bit quantizer 350 according to the circuit design plan. As illustrated in FIG. 1, the pulsed waveform $Y_q$ is delayed via the delay registers 40 and amplified by the SMPA 60, and transmitted to the power combiner 70. Further, the output signal $S_{nc}$ is transmitted to the linear PA 61 and the power combiner 70 that combines the signals from the SMPA 60 and the linear PA 61. The combined signal from the power combiner 70 is then transmitted via the antenna 80.

Accordingly some embodiments of the present disclosure provide that a digital transmitter 100 that includes baseband interfaces 10 to generate digital baseband signals with baseband frequencies, digital-upconverting stages 20 to upconvert the baseband frequencies to radio frequencies (RFs) having a predetermined frequency range, a M-Band ΔΣ modulator 30 to modulate the up-stage signals based on noise shaping and noise quantization processes, delay registers 40 to align phases of the modulated up-stage signals, a noise canceler 50 (out-of-band NC 300), to generate noise canceling signals with a converted polarity, a Switch Mode Power Amplifier 60 (SMPA 60) to amplify the phase aligned modulated up-stage signals up to a predetermined power level, a linear power amplifier 61 (linear PA 61) to amplify the noise canceling signals up to the predetermined power level, a power combiner 70 to combine to generate transmitting signals by combining the amplified phase aligned modulated up-stage signals and the amplified noise canceling signals, and an antenna 80 to transmit the transmitting signals.

The power combiner 70 can be implemented by using combiner circuits or spatial combination in the air using antennas interfaces or power amplifiers architectures can have both amplification and combination such as H-bridge topology. For example, the power combiner 70 can be integrated into the SMPA 60 or the antenna 80. This provides advantages of reducing the number of levels of the canceller. Further, the power combiner 70 can be integrated with the antenna 80. By using the above configurations, the number of levels of the canceller becomes lower. As a result, the PA linear 61 and the power combiner 70 could be removed, allowing simpler circuit configurations and lowering power consumption. Further, the combination between the two waveforms could be done in the SMPA (by means of extended H-bridges, etc.). This also effective for designing simpler circuits and lowering power consumption in the circuits.

In some case, the noise canceler 50 may be the out-of-band NC 300 that includes a comparator 310 having first and second input ports, wherein the first input port receives an input signal of a first quantizer and the second input port receives an output signal of the first quantizer. Further, the first quantizer may be the M-Band ΔΣ modulator 30. The input and output signals of the first quantizer are subtracted to extract a noise component of the input signal of the first quantizer. The out-of-band NC 300 further includes a noise transfer function (NTF) block (or module) 320 to apply a noise transfer function to the noise component of the input signal to generate an NTF noise signal. The out-of-band NC 300 further includes a polarity convertor 330 to reverse a polarity of the NTF noise signal into an opposite polarity, and a second quantizer 350 to generate an N-bit quantization noise signal by quantizing the converted NTF noise signal by N bits, wherein N is a natural number. The second quantizer 350 may be referred to as the N-bit quantizer 350.

To transform an envelope-varying signal into a low-resolution equivalent, ΔΣM can employ signal oversampling, quantization and a feedback loop for shaping the quantization errors. In particular, the quantizer reduces the number of output levels (which inherently adds quantization noise), the over sampler spreads the quantization noise for all the spectrum, while the feedback loop is in charge of shaping the error in order to minimize the in-band noise. To accomplish this, the noise's transfer function applied to the quantization noise (NTF(z)) must maintain the in-band integrity. The formal way to model this kind of modulators is based on the modeling of the non-linear quantizer by a noise source (Eq(z)):

$$Y_Q(z)=STF(z)X(z)+NTF(z)Eq(z) \quad (1)$$

where X(z) is the envelope-varying incoming signal, STF(z) is the transfer function applied to the input signal. Hence, based on this general equation, it is possible to define a second signal (E(z)), which represents the quantization noise presented in the ΔΣ M's output waveform:

$$E(z)=-NTF(z)E_q(z)=-NTF(z)(Y(z)-Y_Q(z)) \quad (2)$$

Taking into account that $E_q(z)$ is introduced in the ΔΣM's quantizer during quantization procedure, thus, one can compute this variable just by digital filtering the comparison between the quantizer's input and output, as illustrated in FIG. 3.

After estimation, the ADT (FIG. 1) can be used: a coarse N-bit quantizer reduces the number of levels, a linear amplifier increases the signal power level before being combined with the amplified pulsed waveform. Afterwards, the out-of-band noise shall be considerably reduced and thus, no fixed filtering mechanism is required. Several advantages of this technique shall be pointed out.

Firstly, the complexity of this proposed technique is considerably inferior as compared to the related art one (FIG. 2). Secondly, it is a scalable technique, in the sense that moving from 1(single)- to M-bands just affects the complexity of the digital FIR/Infinite Impulse Response (IIR) filter. Thirdly, it has no negative impact in the modulator's sampling rate. In other words, pipeline registers can be included in the digital filter to speed up the logic, provided that the pulsed waveform signal is digitally delayed to ensure a proper synchronism between the two branches. Finally, no extra ΔΣ M is required, which is a major advantage because no extra quantization noise is created, leading to an inaccurate prediction of the spectrum's out-of-band noise shaping.

Simulation Results
Implementation

Figure 4:
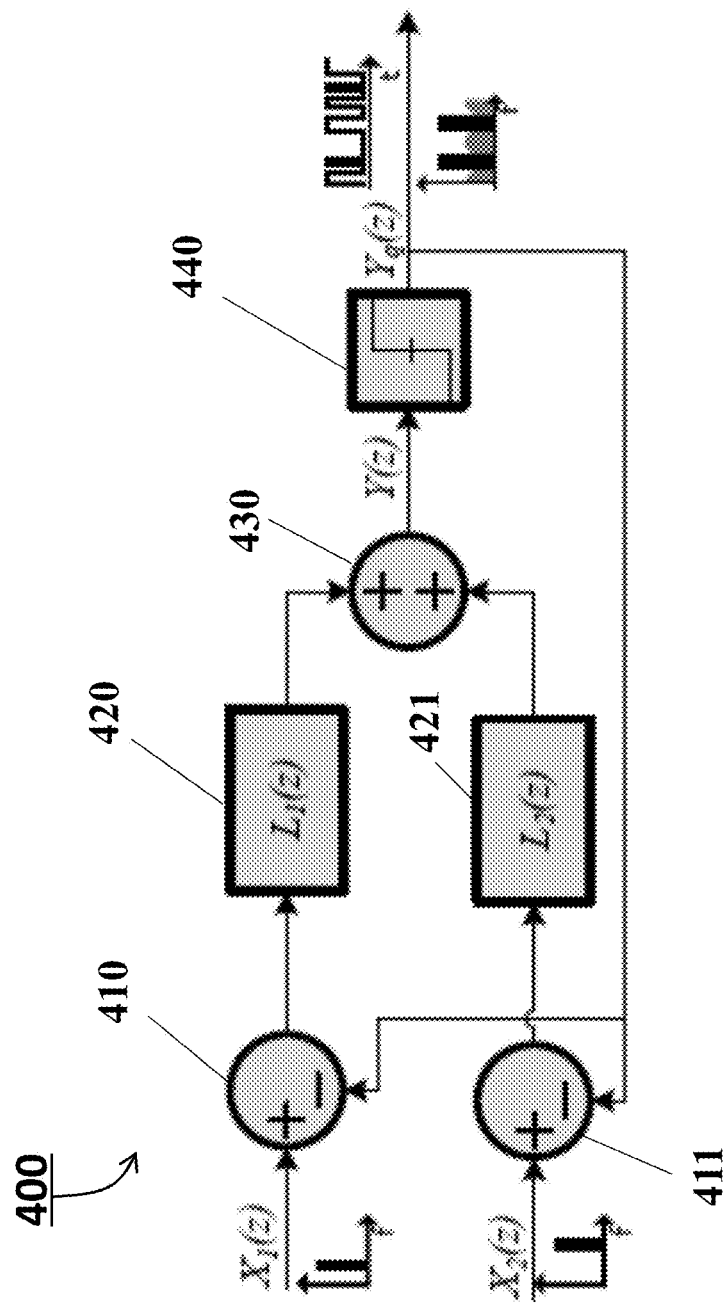
FIG. 4 is an example illustrating a Block diagram of the dual-band $\Delta\Sigma M$ architecture, according to embodiments of the present disclosure.

FIG. 4 is an example illustrating a block diagram of the dual-band ΔΣM architecture 400 according to embodiments of the present disclosure. To validate the quantization noise reduction technique in a multi-band scenario, the OEM's architecture 400 was used as starting point as an example architecture. The dual-band ΔΣ M architecture 400 includes comparators 410 and 411, loop transfer modules 420 and 421, an adder module 430, a one bit quantizer 440. The architecture 400 can be chosen due its capability to independently place each one of the bands.

By modeling the quantization noise by a random noise signal ($E_q(z)$), the following transfer function can be derived:

$$Y_q(z) = \left(\sum_{i=1}^{N} STF_i(z)X_i(z)\right) - NTF(z)E_q(z) \quad (3)$$

$$\text{where } STF_i(z) = \frac{1 + L_i(z)}{1 + \sum_{i=1}^{N} L_i(z)},$$

$$NTF(z) = L_i(z) = \frac{1}{NTF_i(z)} - 1 \text{ and } N = 2,$$

for a dual-band modulator.

However, the loop transfer functions ($L_i(z)$) did not fall in the well-known Cascade of Resonators Feedback Form (CRFB) due to the huge inherent critical path that jeopardizes the future integration in online-based ADTs. Thus, in order to speed up the modulator's sampling rate, a low-complex loop filter was designed with 2 complex zeros to define the notch frequency, together with 2 complex poles to control the Noise-Transfer Function (NTF)'s maximum gain.

Hence, the NTF per band can be easily derived:

$$NTF_0(z) = \frac{1 + \alpha z^{-1} + z^{-2}}{1 + r\alpha z^{-1} + r^2 z^{-2}} \quad (4)$$

$$NTF_1(z) = \frac{1 + \beta z^{-1} + z^{-2}}{1 + r\beta z^{-1} + r^2 z^{-2}} \quad (5)$$

where $+=-2 \cos((2\pi Fc_1)/Fs)$, $\beta=-2 \cos((2\pi Fc_2)/Fs)$ and r controls the distance between each zero and its correspondent pole, and ultimately, the NTF's gain. Following the same reasoning, the loop filters can be defined as:

$$L_0(z) = \frac{\alpha(r-1)z^{-1} + (r^2-1)z^{-2}}{1 + \alpha z^{-1} + z^{-2}} \quad (6)$$

$$L_1(z) = \frac{\beta(r-1)z^{-1} + (r^2-1)z^{-2}}{1 + \beta z^{-1} + z^{-2}} \quad (7)$$

At last, the global NTF can also be derived in a straightforward way:

$$NTF(z) = \frac{1 + Az^{-1} + Bz^{-2} + Cz^{-3} + z^{-4}}{1 + Dz^{-1} + Ez^{-2} + Fz^{-3} + Gz^{-4}} \quad (8)$$

To assess the proposed technique, simulations were carried out in a 40 MHz aggregate bandwidth dual-band transmission at 856 MHz and 1450 MHz, with a sampling rate of 6.25 GSps.

Figure 5:
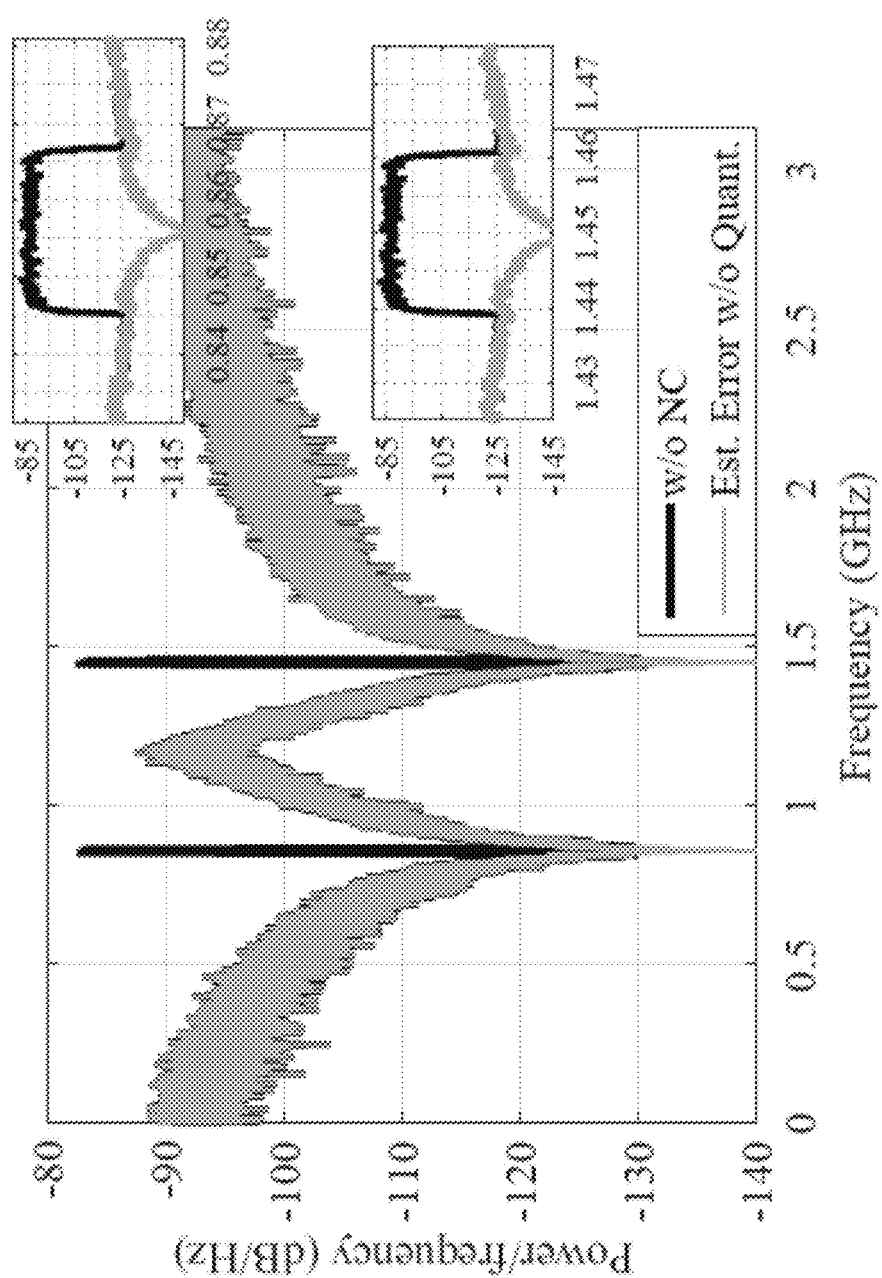
FIG. 5 is an example illustrating the output spectra simulated with and without NC for a 16-QAM, 21.5 MHz per band, according to embodiments of the present disclosure.

FIG. 5 demonstrates that the signal E(z) can faithfully estimate and predict the quantization noise presented in the pulsed waveform (P(z)). Moreover, in addition to enable an improvement of the out-of-band spectrum and Figures of Merits (FoMs) (such as ACPR: adjacent channel power ratio), the in-band ones.

(NMSE, Signal to-Noise Ratio (SNR)) can also be slightly improved because E(z) also estimates the residual in-band quantization noise, leading consequently, to higher bandwidth signals.

Figure 6:
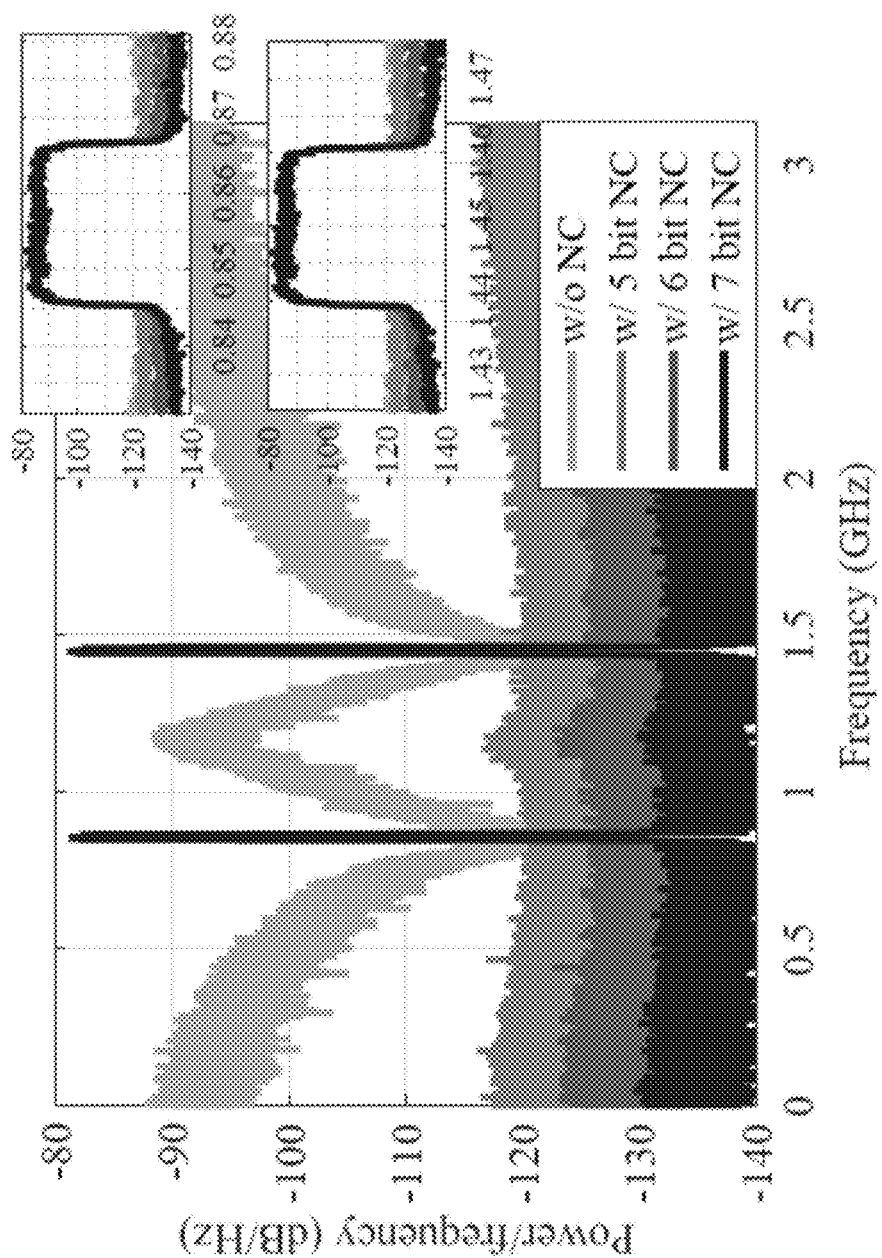
FIG. 6 is an example illustrating the output spectra simulated for different levels of quantization error signals E(z), according to embodiments of the present disclosure.

FIG. 6 demonstrates that the out-of-band noise can be successfully eliminated after combination of the different outputs. Moreover, as can be seen in the zooming figure, the number of levels in the error signal defines the noise floor of the system, and, ultimately, the higher the number of levels, the better will be the overall FoM.

FIG. 7 summarizes the obtained NMSE and ACPR FoMs for different quantization levels, indicating that simulation results in-band and out-of-band FoMs of the present invention technique with and without NC for a 16-Quadrature Amplitude Modulation (QAM), 21.5 MHz per band. As expected, the performance of the system is significantly improved. Even though in the 5-bit NC the NMSE is slightly inferior to the scenario without NC (due to the higher noise floor imposed by the coarse quantization), the output spectrum is almost clean, which leads to a significant reduction of filtering requirements, interference problems as well as to a possible accommodation of higher and bandwidths.

According to some embodiments of the present disclosure, a new optimization can be demonstrated towards the aim of reducing the complexity of out-of-band NC through digitally estimation of the ΔΣ M's quantization noise. Simulations carried out demonstrate that this low-complex technique can demonstrate significant improvements in terms of the major FoMs, at the same time that may lead to analog-filter-free ADT, regardless of the number of frequency bands.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

It would be noted that a circuit may be referred to as a system, and a PWM (pulse width modulation) carrier signal may be referred to as a PWM reference signal, and PWM carrier frequency may be referred to as a PWM reference frequency, and PWM threshold value can be referred to as a constant PWM reference signal.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

We claim:

1. A noise canceler for reducing quantization noises of transmitting signals, comprising:
   a comparator having first and second input ports, wherein the first input port receives an input signal of a first quantizer and the second input port receives an output signal of the first quantizer, wherein the input and output signals of the first quantizer are subtracted to extract a noise component of the input signal of the first quantizer;
   a noise transfer function (NTF) block to apply a noise transfer function to the noise component of the input signal to generate an NTF noise signal;
   a polarity convertor to reverse a polarity of the NTF noise signal into an opposite polarity; and
   a second quantizer to generate an N-bit quantization noise signal by quantizing the converted NTF noise signal by N bits, wherein N is a natural number.

2. The noise canceler of claim 1, wherein the N is equal to or greater than 2.

3. The noise canceler of claim 1, wherein the first quantizer is disposed outside the canceler.

4. The noise canceler of claim 1, wherein the first quantizer is included in a Delta-Sigma Modulator disposed outside the canceler.

5. The noise canceler of claim 1, wherein an output of the second quantizer is connected to a linear power amplifier (PA).

6. The noise canceler of claim 1, wherein the N-bit quantizer generates one of uniform and non-uniform distribution levels.

7. The noise canceler of claim 6, wherein the distribution levels are chosen so as to reduce a number of bits.

8. The noise canceler of claim 1, wherein the polarity converter is arranged after the second quantizer, wherein the second quantizer is arranged after the NTF block.

9. A digital transmitter comprising:
   baseband interfaces to generate digital baseband signals with baseband frequencies;
   digital-upconverting stages to upconvert the baseband frequencies to first radio frequencies (RFs) having a predetermined frequency range;
   a M-Band $\Delta\Sigma$ modulator to modulate the up-stage signals based on noise shaping and noise quantization processes;
   delay registers to align phases of the modulated up-stage signals;
   a noise canceler of claim 1 to generate noise canceling signals with a converted polarity;
   a Switch Mode Power Amplifier (SMPA) to amplify the phase aligned modulated up-stage signals up to a predetermined power level;
   a linear power amplifier (linear PA) to amplify the noise canceling signals up to the predetermined power level;
   a power combiner to combine to generate transmitting signals by combining the amplified phase aligned modulated up-stage signals and the amplified noise canceling signals; and
   an antenna to transmit the transmitting signals.

10. The digital transmitter of claim 9, wherein the N is equal to or greater than 2.

11. The digital transmitter of claim 9, wherein the first quantizer is disposed outside the canceler.

12. The digital transmitter of claim 9, wherein the first quantizer is included in a Delta-Sigma Modulator disposed outside the canceler.

13. The digital transmitter of claim 9, wherein an output of the second quantizer is connected to a linear power amplifier (PA).

14. The digital transmitter of claim 9, wherein the N-bit quantizer generates one of uniform and non-uniform distribution levels.

15. The digital transmitter of claim 14, wherein the distribution levels are chosen so as to reduce a number of bits.

16. The digital transmitter of claim 9, wherein the polarity converter is arranged after the second quantizer, wherein the second quantizer is arranged after the NTF block.

17. The digital transmitter of claim 9, wherein the power combiner is integrated in the SMPA.

18. The digital transmitter of claim 9, wherein the power combiner is integrated in the antenna.

* * * * *